United States Patent
Sun

(10) Patent No.: US 12,236,864 B2
(45) Date of Patent: Feb. 25, 2025

(54) DISPLAY SUBSTRATE AND METHOD FOR PREPARING THE SAME

(71) Applicants: Beijing BOE Technology Development Co., Ltd., Beijing (CN); BOE TECHNOLOGY GROUP CO., LTD., Beijing (CN)

(72) Inventor: Tuo Sun, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,065

(22) PCT Filed: Apr. 2, 2021

(86) PCT No.: PCT/CN2021/085216
§ 371 (c)(1),
(2) Date: Mar. 30, 2022

(87) PCT Pub. No.: WO2022/205405
PCT Pub. Date: Oct. 6, 2022

(65) Prior Publication Data
US 2024/0054952 A1    Feb. 15, 2024

(51) Int. Cl.
*G09G 3/3233* (2016.01)
*H10K 59/12* (2023.01)
(Continued)

(52) U.S. Cl.
CPC ....... *G09G 3/3233* (2013.01); *H10K 59/1201* (2023.02); *H10K 59/1213* (2023.02);
(Continued)

(58) Field of Classification Search
CPC .. H10K 59/1213; H10K 59/131; H10K 71/80; H10K 77/111;
(Continued)

(56) References Cited

U.S. PATENT DOCUMENTS 10,741,777 B2    8/2020  Hwang et al.
2014/0134840 A1*  5/2014  Koo ................. H01L 29/78603
                                                        438/666
(Continued)

FOREIGN PATENT DOCUMENTS

CN    111862826 A    10/2020

OTHER PUBLICATIONS

European Patent Office, EESR dated Jan. 5, 2024, for corresponding EP application 21934062.7.

*Primary Examiner* — Amr A Awad
*Assistant Examiner* — Aaron Midkiff
(74) *Attorney, Agent, or Firm* — HOUTTEMAN LAW LLC

(57) ABSTRACT

There is provided a display substrate including a base and a pixel circuit layer on the base, the pixel circuit layer includes pixel driving circuits arranged in an array along a first direction and a second direction. The base has recesses, each of which extends in the first direction and has a bottom surface and a side surface, a surface of the base includes the bottom surface and the side surface of each recesses, and a top surface between adjacent recesses, the bottom surface of each recess is substantially parallel to the top surface between adjacent recesses, the side surface of each recesses is at a first angle to the bottom surface of the recess and the top surface between adjacent recesses, and a portion of each pixel driving circuits is formed on the side surface of one recess. A method for preparing a display substrate is further provided.

19 Claims, 9 Drawing Sheets

(51) Int. Cl.
*H10K 59/121* (2023.01)
*H10K 59/131* (2023.01)
*H10K 71/20* (2023.01)
*H10K 77/10* (2023.01)

(52) U.S. Cl.
CPC ....... *H10K 59/1216* (2023.02); *H10K 59/131* (2023.02); *H10K 71/20* (2023.02); *H10K 77/111* (2023.02); *G09G 2300/0842* (2013.01); *G09G 2310/061* (2013.01)

(58) Field of Classification Search
CPC ... H10K 59/121–1216; H10K 59/1315; H10K 71/20–236; H10K 50/80; H10K 50/858; H10K 59/122; H10K 59/123; H10K 59/124; H10K 59/879; H10K 2102/311; H10K 2102/351; H10K 71/111; H10K 71/50; H10K 59/1201; G09G 3/035; G09G 3/3233; G09G 2300/0426; G09G 2380/02; G09G 3/32–3291; G09G 2300/0421; G09G 2300/0809–0871; G09G 2300/08–0895; G09G 3/3258; G09G 2310/061; G09G 2300/0842; H01L 24/19; H01L 27/1214; H01L 33/24; H01L 2224/08145; H01L 25/075–0753; H01L 25/13; H01L 31/00–208; H01L 2224/83005; H01L 21/76877; H01L 24/82; H01L 27/14603; H01L 27/14609; H01L 27/14625; H01L 27/14627; H01L 27/1463; H01L 27/156; H01L 29/4236; H01L 29/8613; H01L 31/02327; H01L 33/00–648; H01L 2224/13021; H01L 2224/18; H01L 2224/19; H01L 2224/24; H01L 2224/24146; H01L 2224/32147; H01L 2224/73267; H01L 2224/82; H01L 29/7325; B32B 3/26–30; G02B 3/0006; G02B 6/0073; G02B 30/27; G02B 30/29
See application file for complete search history.

(56) References Cited

U.S. PATENT DOCUMENTS

| | | | |
|---|---|---|---|
| 2017/0133550 A1* | 5/2017 | Schuele | H01L 25/167 |
| 2018/0284465 A1* | 10/2018 | Kwon | H01L 27/1463 |
| 2018/0342201 A1* | 11/2018 | Feng | G09G 3/3208 |
| 2019/0221761 A1* | 7/2019 | Hwang | B32B 27/285 |
| 2020/0150725 A1 | 5/2020 | Saitoh et al. | |
| 2021/0359235 A1* | 11/2021 | Jiang | H10K 59/122 |
| 2022/0063237 A1 | 3/2022 | Liu et al. | |

* cited by examiner

DISPLAY SUBSTRATE AND METHOD FOR PREPARING THE SAME

TECHNICAL FIELD

The present disclosure relates to the field of display technology, and specifically relates to a display substrate and a method for preparing the same.

BACKGROUND

With the development of display technology, OLED or QLED display screens with high resolution are more and more widely used, and higher requirements are put on the resolution of the OLED or QLED display screens. Currently, the resolution of the OLED or QLED display screens is mainly improved by reasonably arranging or sharing pixels of the OLED or QLED display screens, but due to a relatively complex pixel structure of the OLED or QLED display screens, the desired resolution may not be achieved by merely reasonably arranging or sharing the pixels.

SUMMARY

An embodiment of the present disclosure provides a display substrate, including a base, and a pixel circuit layer formed on the base, where the pixel circuit layer includes a plurality of pixel driving circuits arranged in an array along a first direction and a second direction perpendicular to the first direction, the base has recesses, each of which extends in the first direction and has a bottom surface and a side surface, a surface of the base includes the bottom surface and the side surface of each of the recesses, and a top surface between adjacent ones of the recesses, the bottom surface of each of the recesses is substantially parallel to the top surface between adjacent ones of the recesses, the side surface of each of the recesses is at a first angle to the bottom surface of each of the recesses and the top surface between adjacent ones of the recesses, and a portion of each of the pixel driving circuits is formed on the side surface of one of the recesses.

In some implementations, each of the pixel driving circuits includes a driving sub-circuit on the side surface of one of the recesses.

In some implementations, each of the pixel driving circuits includes a storage sub-circuit on the side surface of one of the recesses.

In some implementations, each of the pixel driving circuits includes a data write sub-circuit on the side surface of one of the recesses.

In some implementations, each of the pixel driving circuits includes a light emission control sub-circuit on the top surface between adjacent ones of the recesses.

In some implementations, each of the pixel driving circuits includes a reset sub-circuit on the bottom surface of one of the recesses.

In some implementations, each of the pixel driving circuits includes a signal line extending in the first direction.

In some implementations, each of the pixel driving circuits includes a signal line extending in the second direction, the signal line includes a first portion, a second portion and a third portion, a distance from the first portion to a first bending line where the bottom surface and the side surface of the recess intersect is less than or equal to a first distance, a distance from the second portion to a second bending line where the side surface of the recess and the top surface between adjacent ones of the recesses intersect is less than or equal to a second distance, a distance from the third portion to the first bending line is greater than the first distance, a distance from the third portion to the second bending line is greater than the second distance, the first portion has a width greater than that of the third portion in a direction parallel to the first bending line, and the second portion has a width greater than that of the third portion in a direction parallel to the second bending line.

In some implementations, each of the pixel driving circuits includes a signal line extending in the second direction, the signal line includes a first portion, a second portion and a third portion, a distance from the first portion to a first bending line where the bottom surface and the side surface of the recess intersect is less than or equal to a first distance, a distance from the second portion to a second bending line where the side surface of the recess and the top surface between adjacent ones of the recesses intersect is less than or equal to a second distance, a distance from the third portion to the first bending line is greater than the first distance, a distance from the third portion to the second bending line is greater than the second distance, the first portion has a thickness greater than that of the third portion in a direction away from the bottom surface and the side surface of the recess, and the second portion has a thickness greater than that of the third portion in a direction away from the side surface of the recess and the top surface between adjacent ones of the recesses.

In some implementations, the display substrate further includes a flexible material layer between the base and the pixel circuit layer, a first stress relief structure is disposed in a first portion of the flexible material layer, a distance from the first portion of the flexible material layer to a first bending line where the bottom surface and the side surface of the recess intersect is less than or equal to a first preset distance, and a second stress relief structure is disposed in a second portion of the flexible material layer, a distance from the second portion of the flexible material layer to a second bending line where the side surface of the recess and the top surface between adjacent ones of the recesses intersect is less than or equal to a second preset distance, where each of the first stress relief structure and the second stress relief structure includes a plurality of trapezoidal blocks disposed at intervals, in the first stress relief structure, an end of each of the trapezoidal blocks away from the base has a size smaller than that of an end of the trapezoidal block closer to the base, and in the second stress relief structure, an end of each of the trapezoidal blocks closer to the base has a size smaller than that of an end of the trapezoidal block away from the base.

In some implementations, the side surface and the bottom surface of each of the recesses are connected through a first arc surface, and the side surface of each of the recesses and the top surface between adjacent ones of the recesses are connected through a second arc surface.

In some implementations, in the second direction, adjacent ones of the pixel driving circuits are mirrored.

In some implementations, each of the pixel driving circuits includes a driving sub-circuit, a data write sub-circuit, a light emission control sub-circuit, a reset sub-circuit and a storage sub-circuit, the driving sub-circuit, the data write sub-circuit and the storage sub-circuit are formed on the side surface of one of the recesses, the light emission control sub-circuit is formed on the top surface between adjacent ones of the recesses, and the reset sub-circuit is formed on the bottom surface of one of the recesses, the driving sub-circuit includes a first transistor, the data write sub-circuit includes a second transistor and a third transistor, the storage sub-circuit includes a storage capacitor, the light emission control sub-circuit includes a fourth transistor and a fifth transistor, and the reset sub-circuit includes a sixth transistor, a gate of the first transistor is connected to a first electrode of the second transistor, a first electrode of the storage capacitor, and a first electrode of the sixth transistor, a first electrode of the first transistor is connected to a first electrode of the fourth transistor and a first electrode of the third transistor, and a second electrode of the first transistor is connected to a second electrode of the second transistor and a second electrode of the fifth transistor, gates of the second transistor and the third transistor each are connected to a scan signal line, a second electrode of the third transistor is connected to a data signal line, and a second electrode of the storage capacitor is connected to a first power supply line, a second electrode of the fourth transistor is connected to the first power supply line, and gates of the fourth transistor and the fifth transistor each are connected to a light emission control line, a first electrode of the fifth transistor is connected to an anode of a light-emitting element, and a gate of the sixth transistor is connected to a reset control line, and a second electrode of the sixth transistor is connected to a reset signal line.

In some implementations, in the second direction, adjacent ones of the pixel driving circuits share the reset signal line.

In some implementations, the reset control line, the reset signal line, the scan signal line, and the light emission control line each extend in the first direction, and the data signal line and the first power supply line each include a portion extending in the second direction.

In some implementations, the scan signal line, the reset control line, the light emission control line, the first electrode of the storage capacitor, and the gates of the transistors are formed in a same layer and in a first sub-layer of the pixel circuit layer, the reset signal line and the second electrode of the storage capacitor are formed in a same layer and in a second sub-layer of the pixel circuit layer, and the data signal line, the first power supply line, and the first and second electrodes of the transistors are formed in a same layer and in a third sub-layer of the pixel circuit layer.

In some implementations, the light-emitting element is a quantum dot light-emitting diode.

An embodiment of the present disclosure provides a method for preparing a display substrate, including:

forming a base having recesses, each of which extends in the first direction and has a bottom surface and a side surface, a surface of the base includes the bottom surface and the side surface of each of the recesses, and a top surface between adjacent ones of the recesses, the bottom surface of each of the recesses is substantially parallel to the top surface between adjacent ones of the recesses, the side surface of each of the recesses is at a first angle to the bottom surface of each of the recesses and the top surface between adjacent ones of the recesses; and forming a pixel circuit layer on the base, the pixel circuit layer including a plurality of pixel driving circuits which are arranged in an array along a first direction and a second direction perpendicular to the first direction, where a portion of each of the pixel driving circuits is formed on the side surface of one of the recesses.

In some implementations, the forming a base includes:
forming the base in a preformed mold by using a flexible material.

In some implementations, the forming a pixel circuit layer on the base includes:
forming a flexible material layer on a glass sheet;
forming the pixel driving circuits on the flexible material layer;
peeling off the flexible material layer and the pixel driving circuits formed on the flexible material layer from the glass sheet; and
attaching the flexible material layer and the pixel driving circuits formed on the flexible material layer to the base.

In some implementations, the forming the pixel driving circuits on the flexible material layer includes:
forming a signal line extending in the first direction and a signal line extending in the second direction, and widening and thickening a first portion and a second portion of the signal line extending in the second direction, where
after attaching the flexible material layer and the pixel driving circuits formed on the flexible material layer to the base, a distance from the first portion to a first bending line where the bottom surface and the side surface of the recess intersect is less than or equal to a first distance, and a distance from the second portion to a second bending line where the side surface of the recess and the top surface between adjacent ones of the recesses intersect is less than or equal to a second distance.

In some implementations, the method further includes:
forming a sacrificial material layer on the glass sheet prior to forming the flexible material layer on the glass sheet;
patterning the sacrificial material layer to form a first stress relief structure and a second stress relief structure, where each of the first stress relief structure and the second stress relief structure includes a plurality of trapezoidal blocks disposed at intervals, in the first stress relief structure, an end of each of the trapezoidal blocks away from the glass sheet has a size smaller than that of an end of the trapezoidal block closer to the glass sheet, and in the second stress relief structure, an end of each of the trapezoidal blocks closer to the glass sheet has a size smaller than that of an end of the trapezoidal block away from the glass sheet, where
the first stress relief structure and the second stress relief structure are embedded in the flexible material layer after the flexible material layer is formed on the glass sheet,
when the flexible material layer and the pixel driving circuits formed on the flexible material layer are peeled off from the glass sheet, the first stress relief structure and the second stress relief structure are peeled off from the glass sheet along with the flexible material layer, and
after attaching the flexible material layer and the pixel driving circuits formed on the flexible material layer to the base, a distance from the first stress relief structure to a first bending line where the bottom surface and the side surface of the recess intersect is less than or equal to a first preset distance, and a distance from the second stress relief structure to a second bending line where the side surface of the recess and the top surface between adjacent ones of the recesses intersect is less than or equal to a second preset distance.

DETAIL DESCRIPTION OF EMBODIMENTS

To improve understanding of the technical solution of the present disclosure for those skilled in the art, the present disclosure will be described in detail below with reference to accompanying drawings and specific implementations.

The present disclosure will be described in detail below with reference to the accompanying drawings. Throughout the drawings, elements the same as or similar to each other are indicated by similar reference signs. For the sake of clarity, various parts in the figures are not drawn to scale. Moreover, some well-known parts may not be shown in the figures.

For better understanding of the present disclosure, many specific details, such as structures, materials, dimensions, processing, and techniques of components, of the present disclosure are described below. However, the present disclosure may be implemented without these specific details, as will be understood by those skilled in the art.

In the present disclosure, the first direction and the second direction are interchangeable, and the "first electrode" and the "second electrode" of each transistor are interchangeable.

Figure 1:
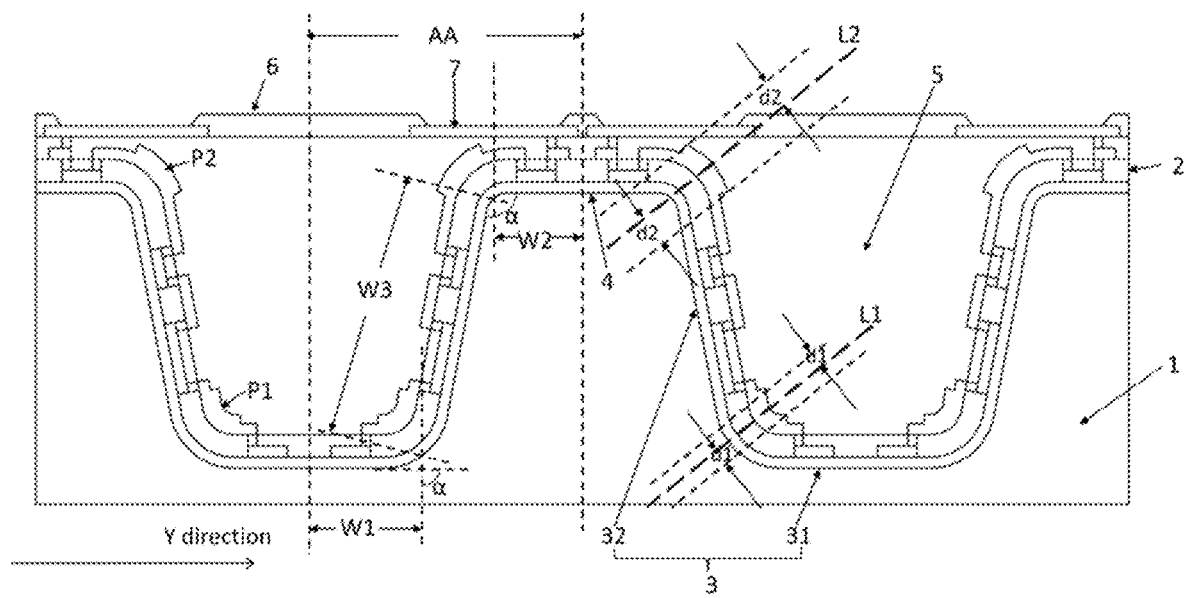
FIG. 1 shows a schematic structural diagram of a display substrate according to an embodiment of the present disclosure.
Figure 2:
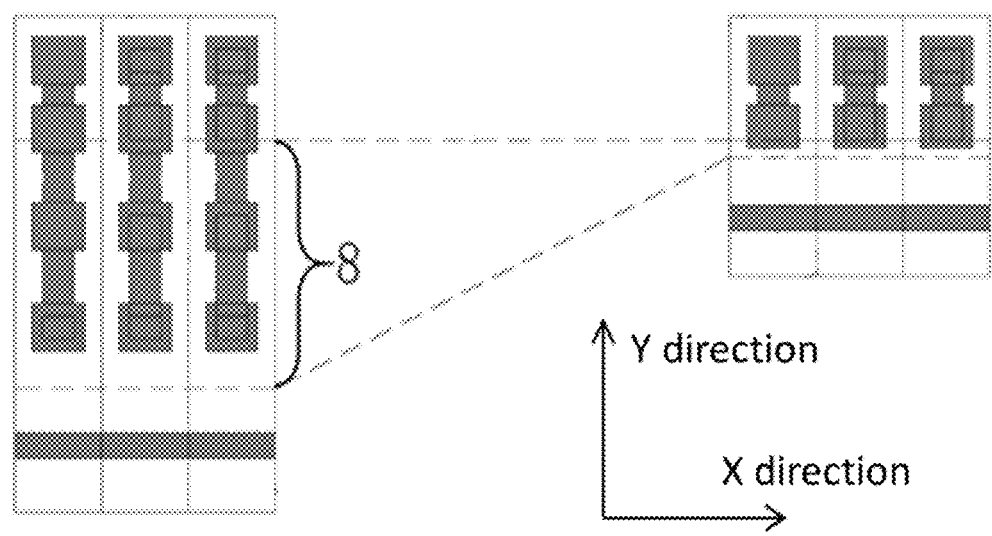
FIG. 2 shows a schematic diagram of pixels in a display substrate according to an embodiment of the present disclosure.

An embodiment of the present disclosure provides a display substrate, and as shown in FIGS. 1 and 2, the display substrate includes a base 1, and a pixel circuit layer 2 formed on the base 1. The pixel circuit layer 2 includes a plurality of pixel driving circuits which are arranged in an array along a first direction (X direction) and a second direction (Y direction), and the first direction is perpendicular to the second direction. The base 1 has recesses 3, each of which extends in the first direction and has a bottom surface 31 and a side surface 32. A surface of the base 1 includes the bottom surface 31 and the side surface 32 of each of the recesses 3, and a top surface 4 between adjacent ones of the recesses 3. The bottom surface 31 of each of the recesses 3 is substantially parallel to the top surface 4 between adjacent ones of the recesses 3, the side surface 32 of each of the recesses 3 is at a first angle α to the bottom surface 31 of the recess 3 and the top surface 4 between adjacent ones of the recesses 3, and a portion of each of the pixel driving circuits is formed on the side surface 32 of one of the recesses 3.

In the embodiment of the present disclosure, the fact that the side surface 32 of each of the recesses 3 is at a first angle α to the bottom surface 31 of the recess 3 and the top surface 4 between adjacent ones of the recesses 3 means that an angle formed inside the recess 3 and between the side surface 32 of the recess 3 and the bottom surface 31 of the recess 3 is equal to the first angle α, and an angle formed outside the recess 3 and between the side surface 32 of the recess 3 and the top surface 4 between adjacent ones of the recesses 3 is equal to the first angle α, as shown in FIG. 1.

The base 1 may be made of a material including, but not limited to, polyimide (PI), polydimethylsiloxane (PDMS), polymethyl methacrylate (PMMA), or polyvinyl chloride (PVC), or any other flexible organic material.

In some implementations, as shown in FIG. 1, the display substrate according to the embodiment of the present disclosure may further include: a planarization layer 5 on a side of the pixel circuit layer 2 away from the base 1; a pixel defining layer 6 on a side of the planarization layer 5 away from the pixel circuit layer 2, and anodes 7 of light-emitting elements corresponding to (e.g., in one-to-one correspondence with) the pixel driving circuits. The anodes 7 of the light-emitting elements are exposed from opening regions of the pixel defining layer 6.

It will be appreciated that the anodes 7 of the light-emitting elements may be connected to the pixel driving circuits in the pixel circuit layer 2 through vias in the planarization layer 5.

The light-emitting elements may be, for example, organic light-emitting diodes (OLEDs) or quantum dot light-emitting diodes (QLEDs).

As shown in FIG. 2, in the display substrate according to the embodiment of the present disclosure, the pixel circuit layer 2 includes folded regions 8 corresponding to side surfaces 32 of the recesses 3. That is, a portion of each of the folded regions 8 of the pixel circuit layer 2 is formed on the side surface 32 of one of the recesses 3. Apparently, an orthographic projection of each of the folded regions 8 on the base 1 has an area greatly reduced compared with an area of the folded region 8 itself.

Specifically, a portion of each of the pixel driving circuits in the pixel circuit layer 2 is located in one of the folded regions 8 and formed on the side surface 32 of one of the recesses 3, so that an orthographic projection of each of the pixel driving circuits in the pixel circuit layer 2 on the base 1 has an area greatly reduced compared with a layout area of the pixel driving circuit itself. In this manner, a density of the anodes 7 of the light-emitting elements in the display substrate according to the embodiment of the present disclosure can be correspondingly increased while ensuring performance of the display substrate, and thus, a relatively high pixel density can be achieved.

It will be appreciated that, in order to make the orthographic projection of the folded region 8 on the base 1 have an area smaller than the area of the folded region 8 itself, the first angle α in the embodiment of the present disclosure may be equal to or greater than about 90° and smaller than about 180°.

In some implementations, in order to meet layout requirements of each of the pixel driving circuits in the pixel circuit layer 2 and make the orthographic projection of each of the pixel driving circuits in the pixel circuit layer 2 on the base 1 have a relatively small area, the first angle α may be greater than or equal to about 90° and less than or equal to about 105°.

In order to reasonably arrange the pixel driving circuits and effectively increase the pixel density, each of the pixel driving circuits in the pixel circuit layer 2 may be arranged in one recess region AA, and in each recess region AA, a sum of an area of part of the bottom surface 31 of the recess 3 and an area of part of the top surface 4 between adjacent ones of the recesses 3 is equal to or half of an area of the side surface 32 of the recess 3.

For example, as shown in FIG. 1, along a direction (e.g., the second direction) perpendicular to the direction in which the recess 3 extends, in each recess region AA, a sum of a width W1 of part of the bottom surface of the recess 3 and a width W2 of part of the top surface between adjacent ones of the recesses 3 is equal to or half of a width W3 of the side surface 32 of the recess 3.

It will be appreciated that the larger the area of the side surface 32 of the recess 3 is, the larger the portion of the pixel driving circuit that can be arranged on the side surface 32 of the recess 3 is, so that the area of the orthographic projection of the pixel driving circuit on the base 1 can be further reduced compared with the layout area of the pixel driving circuit, and the pixel density can be achieved as high as possible.

In some implementations, each pixel driving circuit in the pixel circuit layer 2 may include a plurality of signal lines, each of which may extend in the first direction as desired, so as to ensure performance thereof. If a certain one, of the signal lines, extending in the second direction is inevitable, a first portion P1 and a second portion P2 of the signal line may be widened and/or thickened, a distance from the first portion P1 to a first bending line L1 where the bottom surface 31 and the side surface 32 of the recess 3 intersect is less than or equal to a first distance d1, and a distance from the second portion P2 to a second bending line L2 where the side surface 32 of the recess 3 and the top surface 4 between adjacent ones of the recesses 3 intersect is less than or equal to a second distance d2, so that the signal line is prevented from being broken while passing the first bending line L1 and/or the second bending line L2.

Specifically, the signal line extending in the second direction may include a first portion P1, a second portion P2 and a third portion P3, a distance from the first portion P1 to a first bending line L1 where the bottom surface 31 and the side surface 32 of the recess 3 intersect is less than or equal to a first distance d1, a distance from the second portion P2 to a second bending line L2 where the side surface 32 of the recess 3 and the top surface 4 between adjacent ones of the recesses 3 intersect is less than or equal to a second distance d2, a distance from the third portion P3 to the first bending line L1 is greater than the first distance d1, and a distance from the third portion P3 to the second bending line L2 is greater than the second distance d2. In a direction parallel to the first bending line L1, the first portion P1 may have a width greater than that of the third portion P3, and in a direction parallel to the second bending line L2, the second portion P2 may have a width greater than that of the third portion P3, as will be specifically shown later (i.e., in FIG. 6).

Alternatively, in a direction away from the bottom surface 31 and the side surface 32 of the recess 3, the first portion P1 may have a thickness greater than that of the third portion P3, and in a direction away from the side surface 32 of the recess 3 and the top surface 4 between adjacent ones of the recesses 3, the second portion P2 may have a thickness greater than that of the third portion P3, as shown in FIG. 1.

It will be appreciated that the first distance d1 and the second distance d2 may be the same or different, and those skilled in the art may select values of the first distance d1 and the second distance d2 as desired, as along as the signal line is prevented from being broken while passing the first bending line L1 or the second bending line L2.

In addition, a stress relief structure may be added at the first bending line L1 and/or the second bending line L2 to prevent the signal line from being broken while passing the first bending line L1 and/or the second bending line L2.

Figure 3:
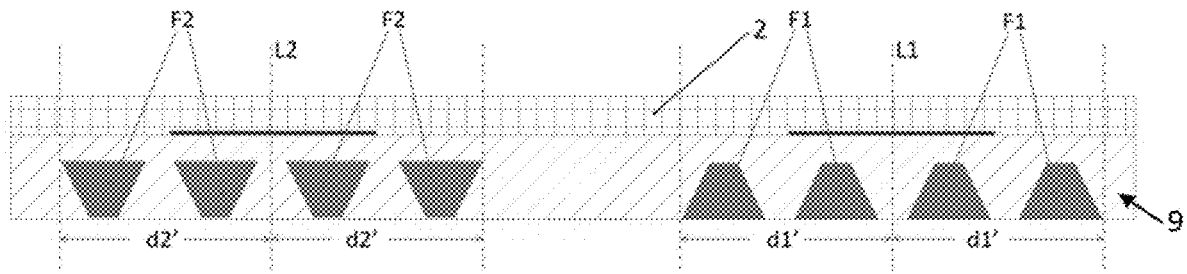
FIG. 3 shows a schematic tiling diagram of a flexible material layer and stress relief structures in a display substrate according to an embodiment of the present disclosure.

In some implementations, as shown in FIG. 3, the display substrate may further include: a flexible material layer 9 between the base 1 and the pixel circuit layer 2, a first stress relief structure F1 may be disposed in a first portion of the flexible material layer 9, and a second stress relief structure F2 may be disposed in a second portion of the flexible material layer 9, a distance from the first portion of the flexible material layer 9 to a first bending line L1 where the bottom surface 31 and the side surface 32 of the recess 3 intersect is less than or equal to a first preset distance d1', a distance from the second portion of the flexible material layer 9 to a second bending line L2 where the side surface 32 of the recess 3 and the top surface 4 between adjacent ones of the recesses 3 intersect is less than or equal to a second preset distance d2'. Each of the first stress relief structure F1 and the second stress relief structure F2 may include a plurality of trapezoidal blocks which are disposed at intervals, in the first stress relief structure F1, an end of each of the trapezoidal blocks away from the base 1 may be smaller than an end of the trapezoidal block closer to the base 1, and in the second stress relief structure F2, an end of each of the trapezoidal blocks closer to the base 1 may be smaller than an end of the trapezoidal block away from the base 1.

It will be appreciated that the first preset distance d1' and the second preset distance d2' may be the same or different, and those skilled in the art may select values of the first preset distance d1' and the second preset distance d2' as desired, as along as the signal line is prevented from being broken while passing the first bending line L1 and/or the second bending line L2.

For convenience of description and illustration, FIG. 3 shows only a schematic tiling diagram of the flexible material layer 9 and the pixel circuit layer 2. As shown in FIG. 3, each trapezoidal block in the first stress relief structure F1 has a regular trapezoid shape, and each trapezoidal block in the second stress relief structure F2 has an inverted trapezoid shape.

The flexible material layer 9 is made of a material including, but not limited to, polyimide (PI), polydimethylsiloxane (PDMS), polymethyl methacrylate (PMMA), polyvinyl chloride (PVC), ultra-thin glass, or a laminate of any of above organic materials and an inorganic material such as silicon oxide and silicon nitride.

In some implementations, the flexible material layer 9 may have a thickness ranging from about 5 μm to about 50 μm.

The first stress relief structure F1 and the second stress relief structure F2 may be made of a sacrificial material such as photoresist, aluminum, or the like, so as to be formed through a patterning process (e.g., dry etching, wet etching, etc.).

Due to provision of the first stress relief structure F1, the signal line, when passing the first bending line L1, achieves stress equilibrium between an end of the signal line closer to the first stress relief structure F1 and an end of the signal line away from the first stress relief structure F1, thereby preventing the signal line from being broken while passing the first bending line L1. Similarly, due to provision of the second stress relief structure F2, the signal line, when passing the second bending line L2, achieves stress equilibrium between an end of the signal line closer to the second stress relief structure F2 and an end of the signal line away from the second stress relief structure F2, thereby preventing the signal line from being broken while passing the second bending line L2.

In some implementations, shapes of the recess 3 at the first bending line L1 and the second bending line L2 may be further modified to prevent the signal line from being broken when passing the corresponding positions (i.e., the first bending line L1 and the second bending line L2).

Figure 4:
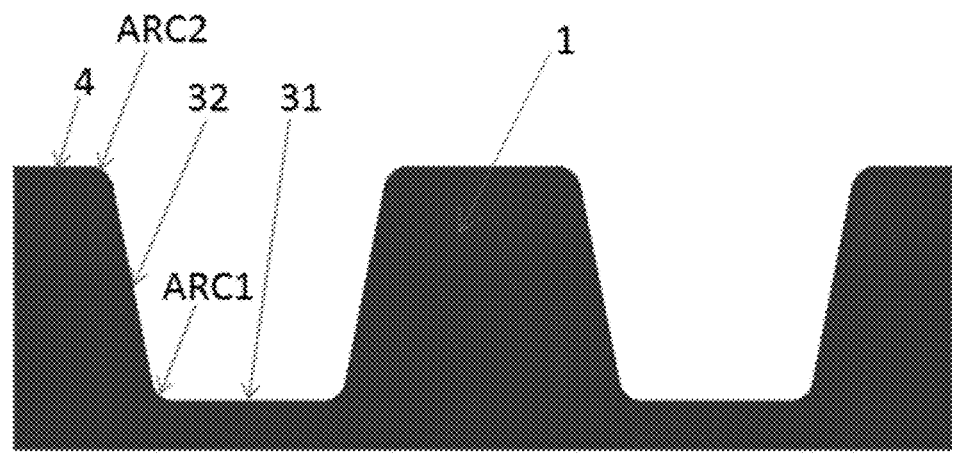
FIG. 4 shows a schematic structural diagram of a base in a display substrate according to an embodiment of the present disclosure.

For example, as shown in FIG. 4, the side surface 32 and the bottom surface 31 of the recess 3 may be connected through a first arc surface ARC1, and the side surface 32 of the recess 3 and the top surface 4 between adjacent ones of the recesses 3 may be connected through a second arc surface ARC2. Apparently, the risk of the signal line being broken when passing the first arc surface ARC1 and the second arc surface ARC2 is reduced.

It will be appreciated that each of the first arc surface ARC1 and the second arc surface ARC2 may be, but is not limited to, a circular arc surface or an elliptical arc surface, which is not specifically limited in the present disclosure, as long as the risk of the signal line being broken when passing the first arc surface ARC1 and the second arc surface ARC2 can be reduced or avoided.

In the embodiment of the present disclosure, each pixel driving circuit may include a driving sub-circuit, a storage sub-circuit, a data write sub-circuit, a light emission control sub-circuit, and a reset sub-circuit. In general, layout of the driving sub-circuit and the storage sub-circuit need a relatively large area, and thus, in order to achieve a relatively high pixel density, the driving sub-circuit and/or the storage sub-circuit may be arranged on the side surface 32 of the recess 3. To further increase the pixel density, the data write sub-circuit having in close connection with the driving sub-circuit may also be arranged on the side surface 32 of the recess 3. For the light emission control sub-circuit, since the light emission control sub-circuit is connected to the light-emitting element, the light emission control sub-circuit may be arranged on the top surface 4 between adjacent ones of the recesses 3 to facilitate the connection between the light emission control sub-circuit and the light-emitting element. In addition, the reset sub-circuit may be arranged on the bottom surface 31 of the recess 3.

It will be appreciated that the layout of the pixel driving circuit may not be limited to those described above. For example, no sub-circuit may be arranged on the bottom surface 31 of the recess 3, however, since there are connections between adjacent pixel driving circuits, a connection structure (e.g., a connection electrode, a connection line, etc.) between adjacent pixel circuits may be arranged on the bottom surface 31 of the recess 3.

In some implementations, to facilitate the overall layout and reduce the process difficulty, each pixel driving circuit may occupy substantially a same area on the bottom surface 31 of the recess 3, and each pixel driving circuit may occupy substantially a same area on the top surface 4 between adjacent ones of the recesses 3.

Figure 5:
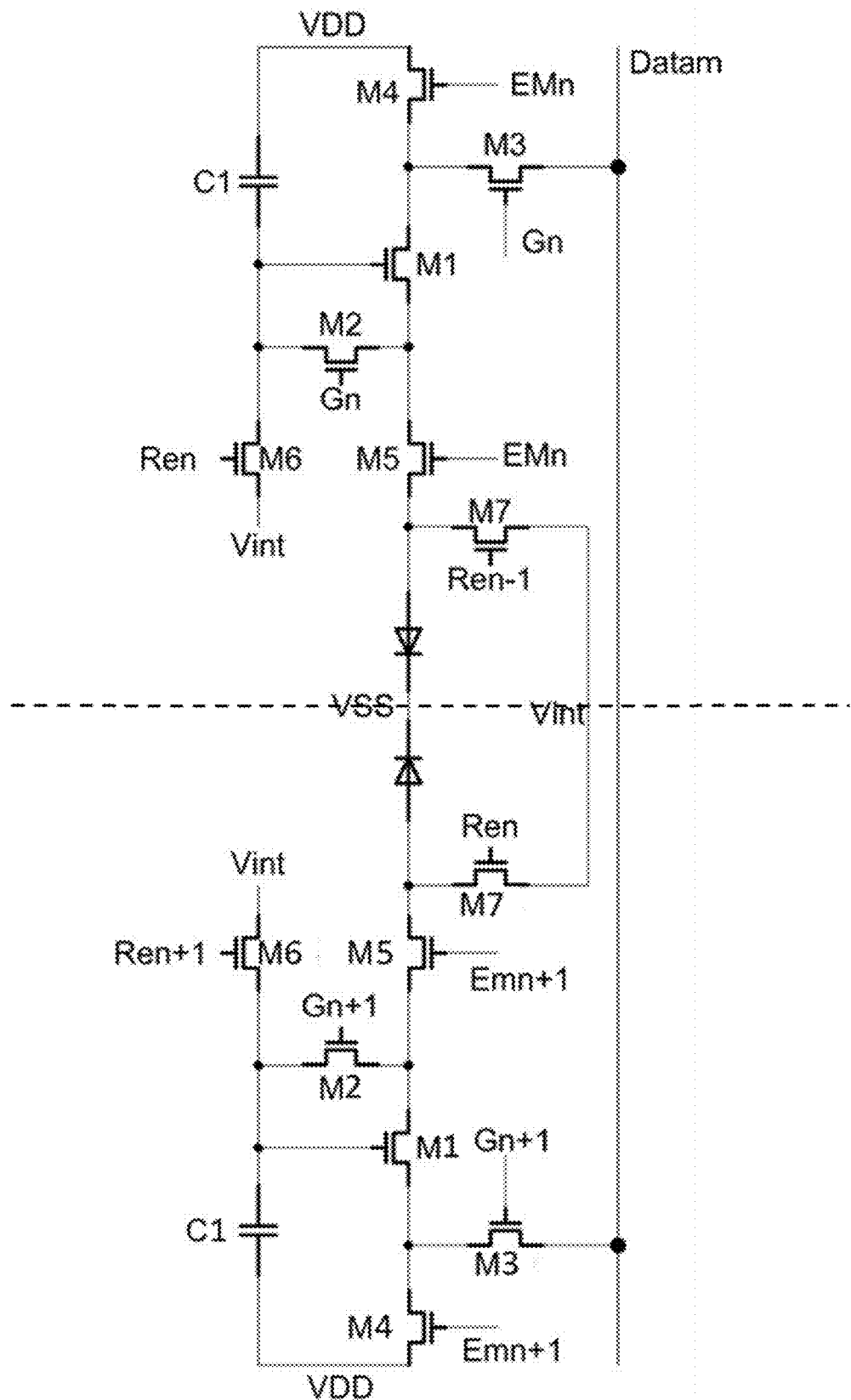
FIG. 5 shows a schematic circuit diagram of a pixel driving circuit in a display substrate according to an embodiment of the present disclosure.

As shown in FIG. 5, in the embodiment of the present disclosure, the driving sub-circuit may include a first transistor M1, the storage sub-circuit may include a storage capacitor C1, the data write sub-circuit may include a second transistor M2 and a third transistor M3, the light emission control sub-circuit may include a fourth transistor M4 and a fifth transistor M5, and the reset sub-circuit may include a sixth transistor M6. A gate of the first transistor M1 is connected to a first electrode of the second transistor M2, a first electrode of the storage capacitor C1, and a first electrode of the sixth transistor M6, a first electrode of the first transistor M1 is connected to a first electrode of the fourth transistor M4 and a first electrode of the third transistor M3, and a second electrode of the first transistor M1 is connected to a second electrode of the second transistor M2 and a second electrode of the fifth transistor M5. Gates of the second transistor M2 and the third transistor M3 each are connected to a scan signal line, and a second electrode of the third transistor M3 is connected to a data signal line. A second electrode of the storage capacitor C1 is connected to a first power supply line VDD. A second electrode of the fourth transistor M4 is connected to the first power supply line VDD, and gates of the fourth transistor M4 and the fifth transistor M5 each are connected to a light emission control line. A first electrode of the fifth transistor M5 is connected to an anode of a light-emitting element (e.g., OLED or QLED). A gate of the sixth transistor M6 is connected to a reset control line, and a second electrode of the sixth transistor M6 is connected to a reset signal line Vint.

For convenience of description, in the embodiment of the present disclosure, a case where the first direction (X direction) is a direction of a row (i.e., row direction), and the second direction (Y direction) is a direction of a column (i.e., column direction) is taken as an example for explanation. That is, the description will be made by taking a case where each of the recesses 3 extends in the row direction as an example.

The pixel driving circuits in a same row may be connected to a same scan signal line, a same light emission control line and a same reset control line, and the pixel driving circuits in a same column may be connected to a same data signal line. For example, in each pixel driving circuit in an $n^{th}$ row, the gates of the second transistor M2 and the third transistor M3 each are connected to a scan signal line Gn, the gates of the fourth transistor M4 and the fifth transistor M5 each are connected to a light emission control line EMn, and the gate of the sixth transistor M6 is connected to a reset control line Ren; in each pixel driving circuit in an $(n+1)^{th}$ row, the gates of the second transistor M2 and the third transistor M3 each are connected to a scan signal line Gn+1, the gates of the fourth transistor M4 and the fifth transistor M5 each are connected to a light emission control line EMn+1, and the gate of the sixth transistor M6 is connected to a reset control line Ren+1; and in each pixel driving circuit in an $m^{th}$ column, the second electrode of the third transistor M3 is connected to a data signal line Datam.

In some implementations, the pixel driving circuit may further include a seventh transistor M7, and a first electrode of the seventh transistor M7 may be connected to the first electrode of the fifth transistor M5 and the anode of the light-emitting element. In each pixel driving circuit in the $n^{th}$ row, a gate of the seventh transistor M7 may be connected to a reset control line Ren−1 for a previous row of pixel driving circuits; and in each pixel driving circuit in the $(n+1)^{th}$ row, the gate of the seventh transistor M7 may be connected to a reset control line Ren for a previous row of pixel driving circuits.

It will be appreciated that in each row of pixel driving circuits, the gate of the seventh transistor M7 may be connected to a reset control line for a next row of pixel driving circuits. For example, in each pixel driving circuit in the $n^{th}$ row, the gate of the seventh transistor M7 may be connected to a reset control line Ren+1 for a next row of pixel driving circuits, which is not shown and described in detail in the present disclosure.

In the embodiment of the present disclosure, in a case where each of the recesses 3 extends along the row direction, the pixel driving circuits in a same column and in adjacent rows may be arranged in a mirrored manner, as shown in FIG. 5, so as to further facilitate the overall layout and reduce the process difficulty.

Further, the pixel driving circuits in a same column may share the reset signal line Vint, as shown in FIG. 5, so as to reduce wiring or the like.

Figure 6:
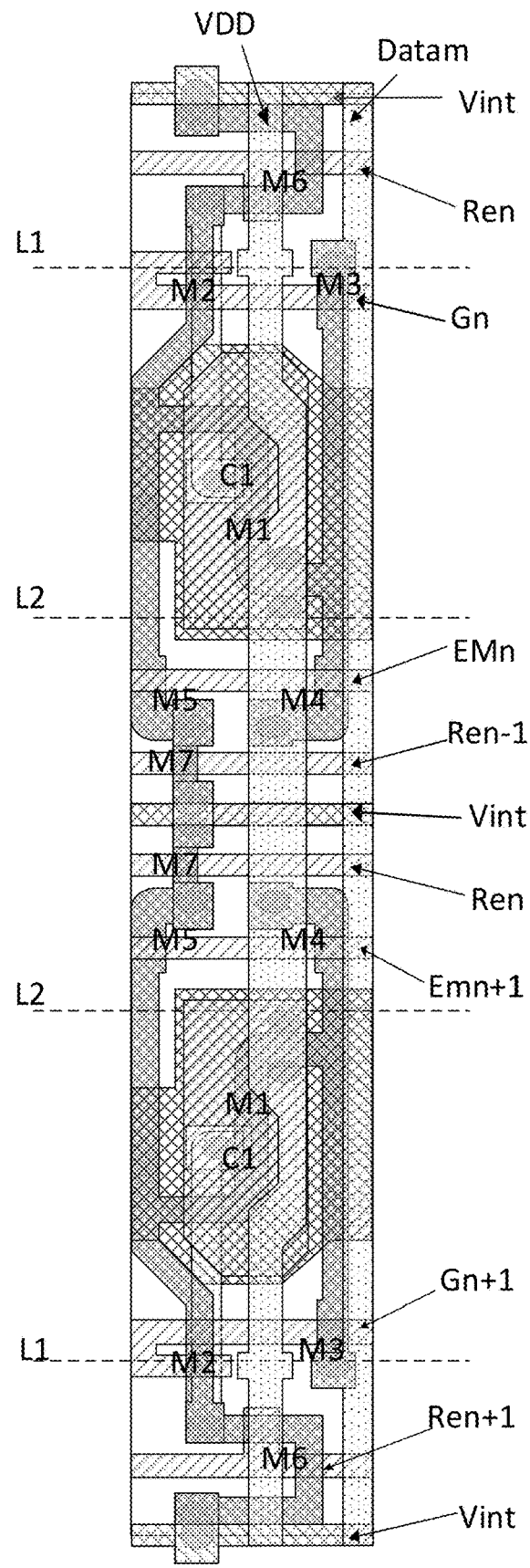
FIG. 6 shows a schematic layout diagram of the pixel driving circuit of FIG. 5.

FIG. 6 shows a schematic layout diagram of the pixel driving circuit of FIG. 5. As shown in FIG. 6, the first transistor M1, the second transistor M2, the third transistor M3, and the storage capacitor C may be arranged on the side surface 32 of the recess 3, the fourth transistor M4, the fifth transistor M5, and the seventh transistor M7 may be arranged on the top surface 4 between adjacent ones of the recesses 3, and the sixth transistor M6 may be arranged on the bottom surface 31 of the recess 3.

In the example shown in FIG. 6, the pixel driving circuits in a same column and in adjacent rows are arranged in a mirrored manner and share the reset signal line Vint.

In addition, in a case where each of the recesses 3 extends along the row direction, as shown in FIG. 6, the reset control line (e.g., Ren−1, Ren, Ren+1), the reset signal line Vint, the scan signal line (e.g., Gn, Gn+1), the light emission control line (e.g., EMn, EMn+1), and the like each may extend in the first direction (i.e., the row direction), so as to prevent any of the signal lines from being broken while passing the first bending line L1 and/or the second bending line L2; the data signal line (e.g., Datam) and the first power supply line VDD each may include a portion extending in the second direction. However, portions of the data signal line and/or the power supply line VDD extending in the second direction and passing the first bending line L1 and/or the second bending line L2 may be widened in a direction parallel to the first bending line L1 and/or the second bending line L2 (as shown in FIG. 6), and/or may be thickened in a direction away from the surface (e.g., the bottom surface 31 of the recess 3, the side surface 32 of the recess 3, or the top surface 4 between adjacent ones of the recesses 3) where the portions are formed, as shown in FIG. 1, so as to prevent any of the data signal lines and the power supply line VDD from being broken when passing the first bending line L1 and/or the second bending line L2.

Figure 7:
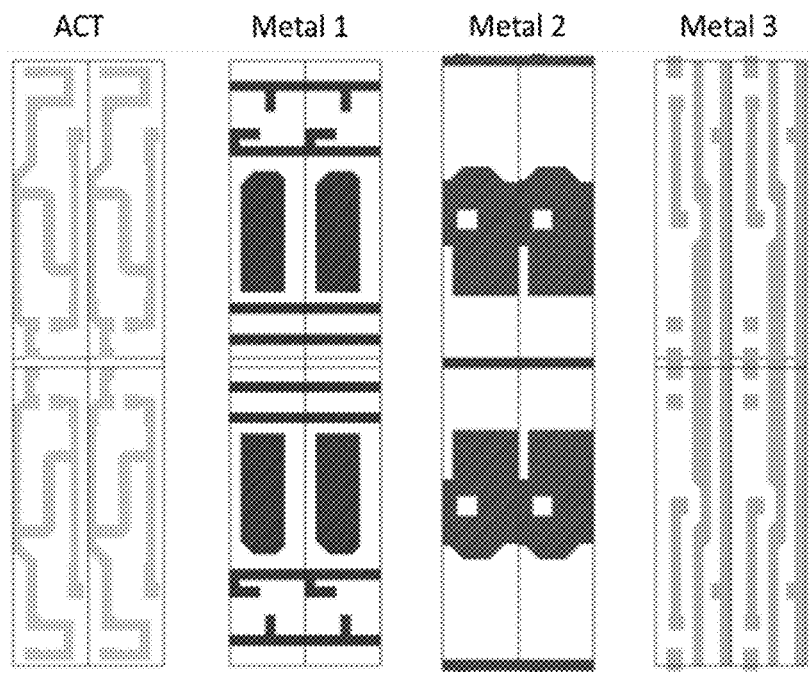
FIG. 7 shows a schematic layout diagram of layers of the pixel driving circuit of FIG. 5.

FIG. 7 shows a schematic layout diagram of layers of the pixel driving circuit of FIG. 5.

As shown in FIG. 7, in the pixel driving circuit shown in FIG. 5, the reset control line (e.g., Ren−1, Ren, Ren+1), the scan signal line (e.g., Gn, Gn+1), the light emission control line (e.g., EMn, EMn+1), the first electrode of the storage capacitor C1, and the gates of the transistors (including the first transistor M1, the second transistor M2, the third transistor M3, the fourth transistor M4, the fifth transistor M5, the sixth transistor M6, and the seventh transistor M7) may be formed in a same layer and in a first sub-layer Metal1, the reset signal line Vint and the second electrode of the storage capacitor C1 may be formed in a same layer and in a second sub-layer Metal2, and the data signal line (e.g., Datam), the first power supply line VDD, and first and second electrodes of the transistors (including the first transistor M1, the second transistor M2, the third transistor M3, the fourth transistor M4, the fifth transistor M5, the sixth transistor M6, and the seventh transistor M7) may be formed in a same layer and in a third sub-layer Metal3, so as to reduce process steps, and reduce the process difficulty.

In addition, active layers of the transistors (including the first transistor M1, the second transistor M2, the third transistor M3, the fourth transistor M4, the fifth transistor M5, the sixth transistor M6, and the seventh transistor M7) may be formed in a same layer and in a fourth sub-layer ACT.

It will be appreciated that, as desired, an insulation layer and/or a dielectric layer may be formed between the first sub-layer, the second sub-layer, the third sub-layer and the fourth sub-layer, and a via may be formed in the insulation layer and/or the dielectric layer so that different sub-layers may be connected to each other through the via in the insulation layer and/or the dielectric layer.

It will be appreciated that, in the embodiment of the present disclosure, each of the recesses 3 may extend along the column direction, in such case, the pixel driving circuits in a same row and in adjacent columns may be arranged in a mirrored manner, and the pixel driving circuits in a same row and in adjacent columns may share the reset signal line Vint, so as to facilitate the overall layout, and reduce the process difficulty and wiring.

In addition, in a case where each of the recesses 3 extends along the column direction, the signal line, extending in a direction perpendicular to and intersecting with the direction in which the recess 3 extends, may be not the data signal line or the power supply line VDD, but portions of the signal line, extending in the direction perpendicular to the direction in which the recess 3 extends, passing the first bending line L1 and the second bending line L2 may still be widened and/or thickened to prevent the signal line from being broken.

According to the embodiment of the present disclosure, those ordinary skilled in the art shall be able to obtain the embodiment in which the recess 3 extends in the column direction, which are thus not shown or described in detail in the present disclosure any more.

In the embodiment of the present disclosure, not only the portions of the signal line passing the first bending line L1 and the second bending line L2 may be widened and/or thickened, portions of other structures (e.g., electrodes, etc.), in the pixel driving circuit, passing the first bending line L1 and/or the second bending line L2, if any, may also be widened and/or thickened to prevent the portions from being broken, which is not shown and described in detail in the present disclosure any more.

Figure 8:
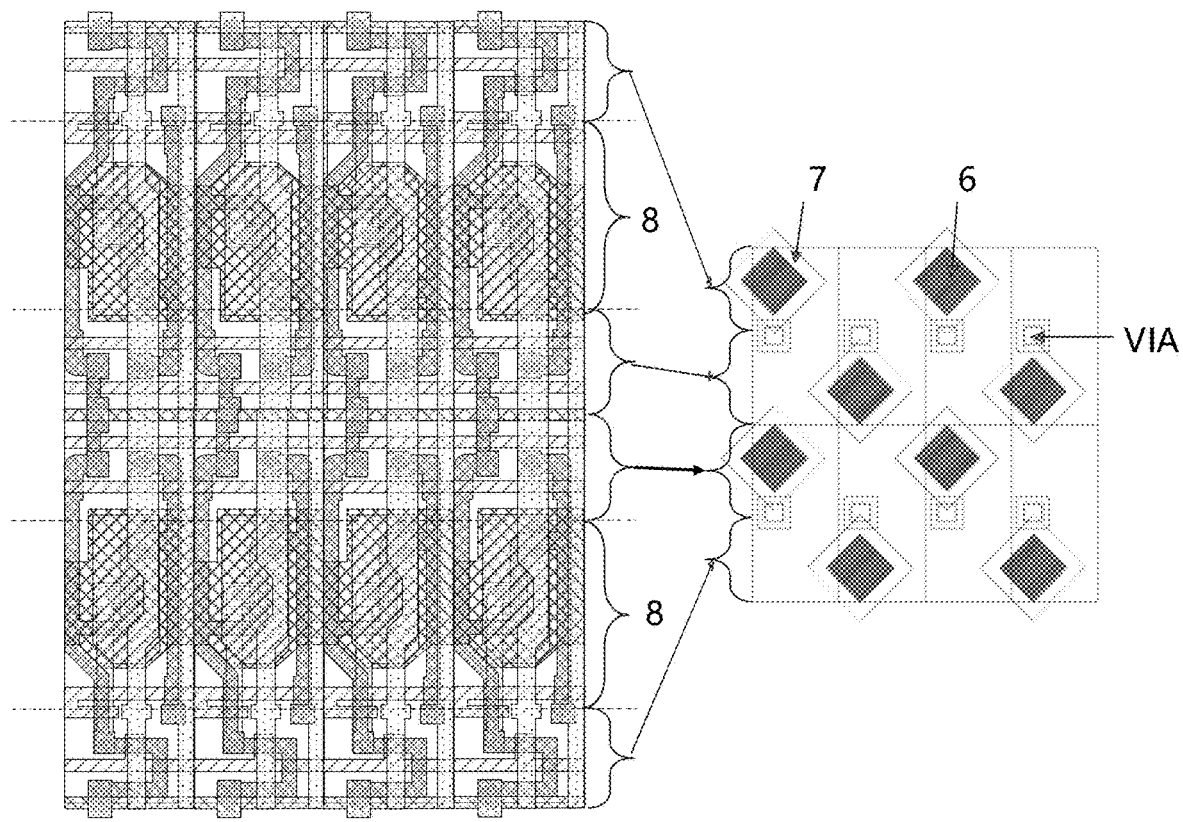
FIG. 8 shows a schematic diagram illustrating a layout of a pixel driving circuit and an arrangement of pixels in a display substrate according to an embodiment of the present disclosure.

FIG. 8 shows a schematic diagram illustrating a layout of a pixel driving circuit and an arrangement of pixels in a display substrate according to an embodiment of the present disclosure.

As shown in FIG. 8, the folded region 8 in which the pixel driving circuits are arranged almost has no effect on the arrangement of pixels, and the pixel driving circuits may correspond to a diamond shaped arrangement of pixels to achieve a relatively high resolution.

The diamond shaped arrangement of pixels is a typical arrangement of pixels, which can result in a relatively high resolution, and is not described in detail in the present disclosure.

In addition, the schematic diagram of FIG. 8 shows vias VIA in the planarization layer 5, through which anodes 7 of the light-emitting elements can be connected to the pixel driving circuits in the pixel circuit layer 2.

Figure 9:
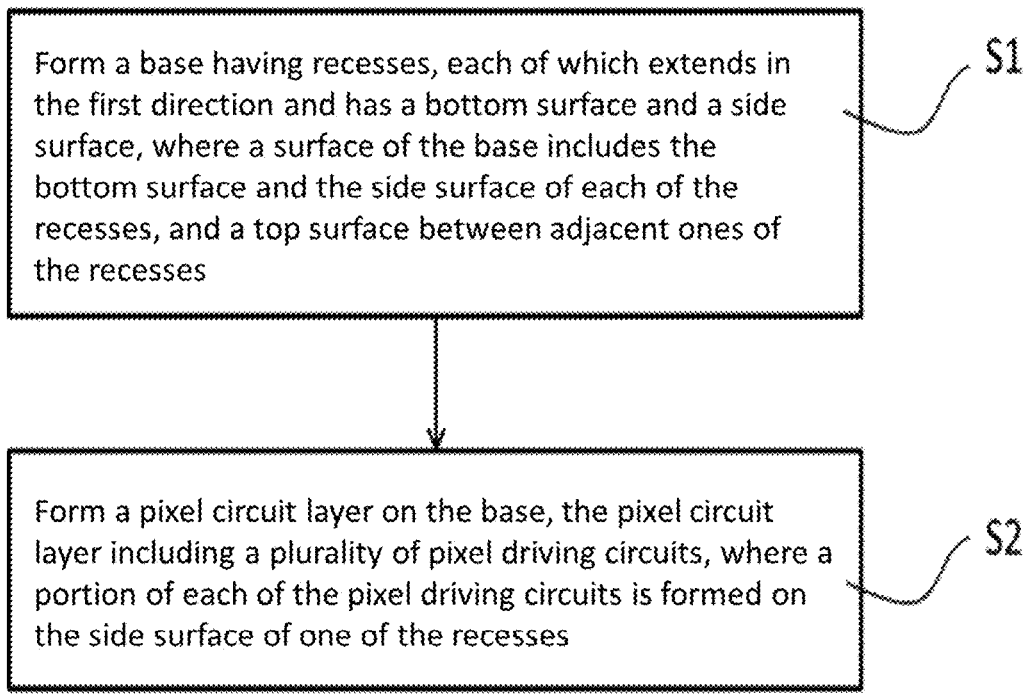
FIG. 9 shows a flowchart of a method for preparing a display substrate according to an embodiment of the present disclosure.

An embodiment of the present disclosure further provides a method for preparing the display substrate as described above, and as shown in FIG. 9, the method includes the following steps S1 and S2. At S1, a base 1 having recesses 3 is formed, and each of the recesses 3 extends in a first direction and has a bottom surface 31 and a side surface 32. A surface of the base 1 includes the bottom surface 31 and the side surface 32 of each of the recesses 3, and a top surface 4 between adjacent ones of the recesses 3. The bottom surface 31 of each of the recesses 3 is substantially parallel to the top surface 4 between adjacent ones of the recesses 3, and the side surface 32 of each of the recesses 3 is at a first angle α to the bottom surface 31 of the recess 3 and the top surface 4 between adjacent ones of the recesses 3. At S2, a pixel circuit layer 2 including a plurality of pixel driving circuits is formed on the base 1, and the pixel driving circuits are arranged in an array along the first direction and a second direction perpendicular to the first direction. A portion of each of the pixel driving circuits is formed on the side surface 32 of one of the recesses 3.

In some implementations, the step S1 may include: forming the base 1 in a preformed mold by using a flexible material.

The flexible material may include, but is not limited to, polyimide (PI), polydimethylsiloxane (PDMS), polymethyl methacrylate (PMMA), polyvinyl chloride (PVC), or any other flexible organic material.

Figure 10:
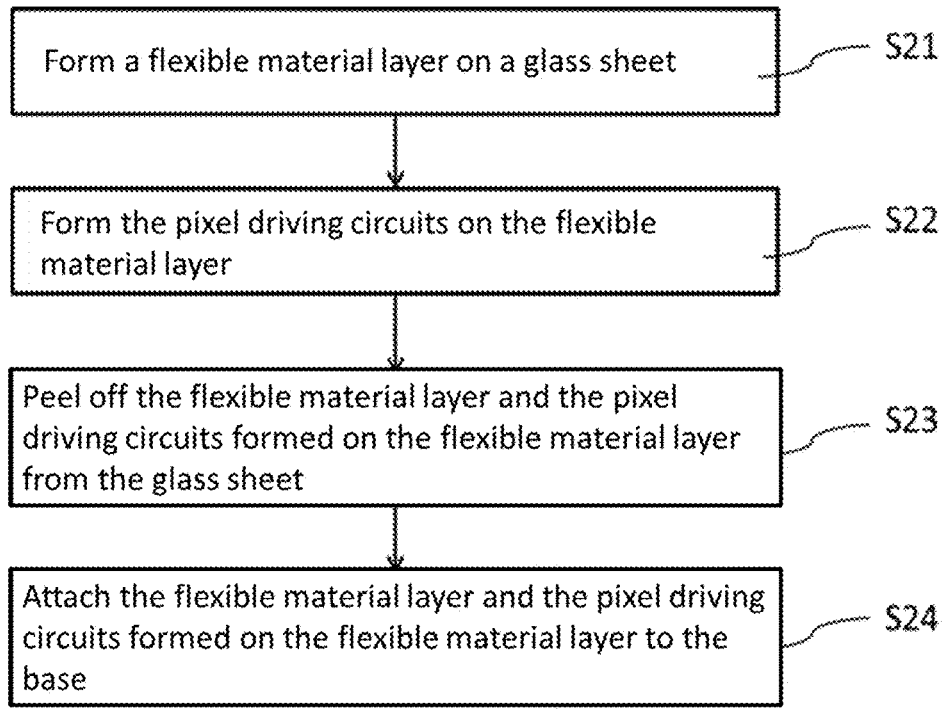
FIG. 10 shows a schematic flowchart of forming a pixel circuit layer on a base in a method for preparing a display substrate according to an embodiment of the present disclosure.

In some implementations, as shown in FIG. 10, the step S2 may include: S21, forming a flexible material layer 9 on a glass sheet; S22, forming the pixel driving circuits on the flexible material layer 9; S23, peeling off the flexible material layer 9 and the pixel driving circuits formed on the flexible material layer 9 from the glass sheet; and S24, attaching the flexible material layer 9 and the pixel driving circuits formed on the flexible material layer 9 to the base 1.

The flexible material layer 9 is made of a material including, but not limited to, polyimide (PI), polydimethylsiloxane (PDMS), polymethyl methacrylate (PMMA), polyvinyl chloride (PVC), ultra-thin glass, or a laminate of any of above organic materials and an inorganic material such as silicon oxide and silicon nitride. The flexible material layer may have a thickness ranging from 5 μm to 50 μm.

In some implementations, the step S22 may include: forming a signal line extending in the first direction and a signal line extending in the second direction, and widening and thickening a first portion P1 and a second portion P2 of the signal line extending in the second direction. After the step S24, a distance from the first portion P1 to a first bending line L1 where the bottom surface 31 and the side surface 32 of the recess 3 intersect is less than or equal to a first distance d1, and a distance from the second portion P2 to a second bending line L2 where the side surface 32 of the recess 3 and the top surface 4 between adjacent ones of the recesses 3 intersect is less than or equal to a second distance d2.

It will be appreciated that the first distance d1 and the second distance d2 may be the same or different, and those skilled in the art may select values of the first distance d1 and the second distance d2 as desired, as along as the signal line is prevented from being broken while passing the first bending line L1 or the second bending line L2.

In some implementations, the step S22 may include: forming a reset control line (e.g., Ren−1, Ren, Ren+1), a scan signal line (e.g., Gn, Gn+1), a light emission control line (e.g., EMn, EMn+1), a first electrode of a storage capacitor C1, and gates of transistors (including the first transistor M1, the second transistor M2, the third transistor M3, the fourth transistor M4, the fifth transistor M5, the sixth transistor M6, and the seventh transistor M7) in a same layer and in a first sub-layer Metal1 by a single patterning process; forming a reset signal line Vint and a second electrode of the storage capacitor C1 in a same layer and in a second sub-layer Metal2 by a single patterning process; and forming a data signal line (e.g., Datam), a first power supply line VDD, and first and second electrodes of the transistors (including the first transistor M1, the second transistor M2, the third transistor M3, the fourth transistor M4, the fifth transistor M5, the sixth transistor M6, and the seventh transistor M7) in a same layer and in a third sub-layer Metal3 by a single patterning process.

In some implementations, the step S22 may further include: forming active layers of the transistors (including the first transistor M1, the second transistor M2, the third transistor M3, the fourth transistor M4, the fifth transistor M5, the sixth transistor M6, and the seventh transistor M7) in a same layer and in a fourth sub-layer ACT by a single patterning process.

It will be appreciated that, as desired, an insulation layer and/or a dielectric layer may be formed between the first sub-layer, the second sub-layer, the third sub-layer and the fourth sub-layer, and a via may be formed in the insulation layer and/or the dielectric layer so that different sub-layers may be connected to each other through the via in the insulation layer and/or the dielectric layer.

In some implementations, the step S23 may include: peeling off the flexible material layer 9 and the pixel driving circuits formed on the flexible material layer 9 from the glass sheet by a laser lift off (LLO) technique.

Specifically, an interface between the flexible material layer 9 and the glass sheet may be scanned by using an infrared laser from a side of the glass sheet away from the flexible material layer 9, so that the flexible material layer 9 absorbs heat and generate a deformation, and under ablation by the infrared laser, bonding between the flexible material layer 9 and the glass sheet is damaged. As a result, the flexible material layer 9 and the pixel driving circuits formed on the flexible material layer 9 are peeled off from the glass sheet.

In some implementations, the step S24 may include: attaching the flexible material layer 9 and the pixel driving circuits formed on the flexible material layer 9 to the base 1 by means of mechanical imprinting, electrostatic adsorption, or the like.

Figure 11:
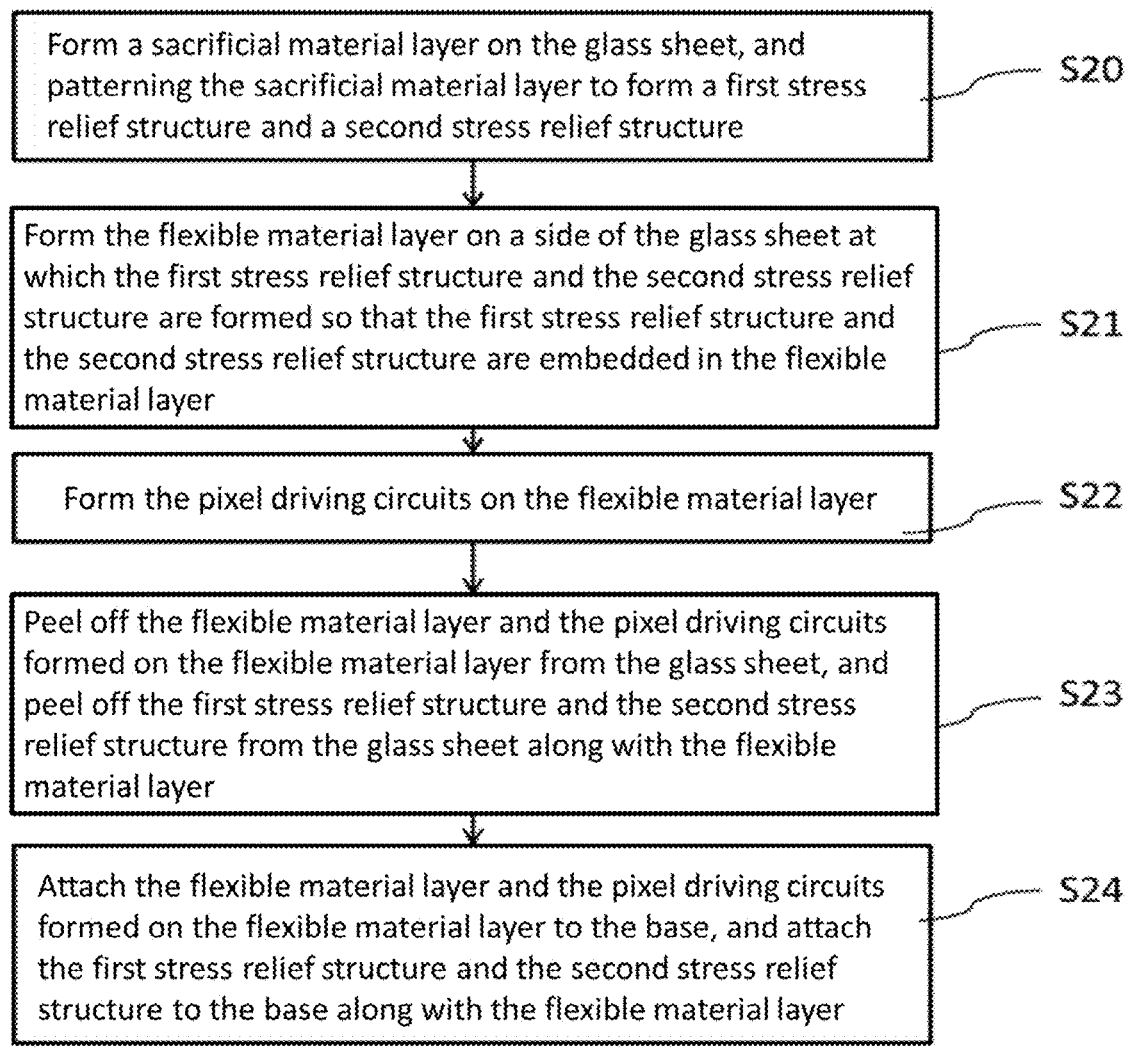
FIG. 11 shows another schematic flowchart of forming a pixel circuit layer on a base in a method for preparing a display substrate according to an embodiment of the present disclosure.

In some implementations, as shown in FIG. 11, the method may further include a step S20. At S20, before the step S21, a sacrificial material layer is formed on the glass sheet, and the sacrificial material layer is patterned to form a first stress relief structure F1 and a second stress relief structure F2. Each of the first stress relief structure F1 and the second stress relief structure F2 includes a plurality of trapezoidal blocks which are disposed at intervals, and in the first stress relief structure F1, an end of each of the trapezoidal blocks away from the glass sheet has a size smaller than that of an end of the trapezoidal block closer to the glass sheet, and in the second stress relief structure F2, an end of each of the trapezoidal blocks closer to the glass sheet has a size smaller than that of an end of the trapezoidal block away from the glass sheet.

In such case, in the step S21, the flexible material layer 9 is formed on a side of the glass sheet where the first stress relief structure F1 and the second stress relief structure F2 are formed, so that the first stress relief structure F1 and the second stress relief structure F2 are embedded in the flexible material layer 9; in the step S23, the first stress relief structure F1 and the second stress relief structure F2 are peeled off from the glass sheet along with the flexible material layer 9; in the step S24, the first stress relief structure F1 and the second stress relief structure F2 are attached to the base 1 along with the flexible material layer 9; and afterwards, a distance from the first stress relief structure F1 to a first bending line L1 where the bottom surface 31 and the side surface 32 of the recess 3 intersect is less than or equal to a first preset distance d1', and a distance from the second stress relief structure F2 to a second bending line L2 where the side surface 32 of the recess 3 and the top surface 4 between adjacent ones of the recesses 3 intersect is less than or equal to a second preset distance d2'.

It will be appreciated that the first preset distance d1' and the second preset distance d2' may be the same or different, and those skilled in the art may select values of the first preset distance d1' and the second preset distance d2' as desired, as along as the signal line is prevented from being broken while passing the first bending line L1 and/or the second bending line L2.

The sacrificial material layer may include a sacrificial material such as photoresist, aluminum, etc., so as to form the first stress relief structure F1 and the second stress relief structure F2 through a patterning process (e.g., dry etching, wet etching, etc.).

Figure 12:
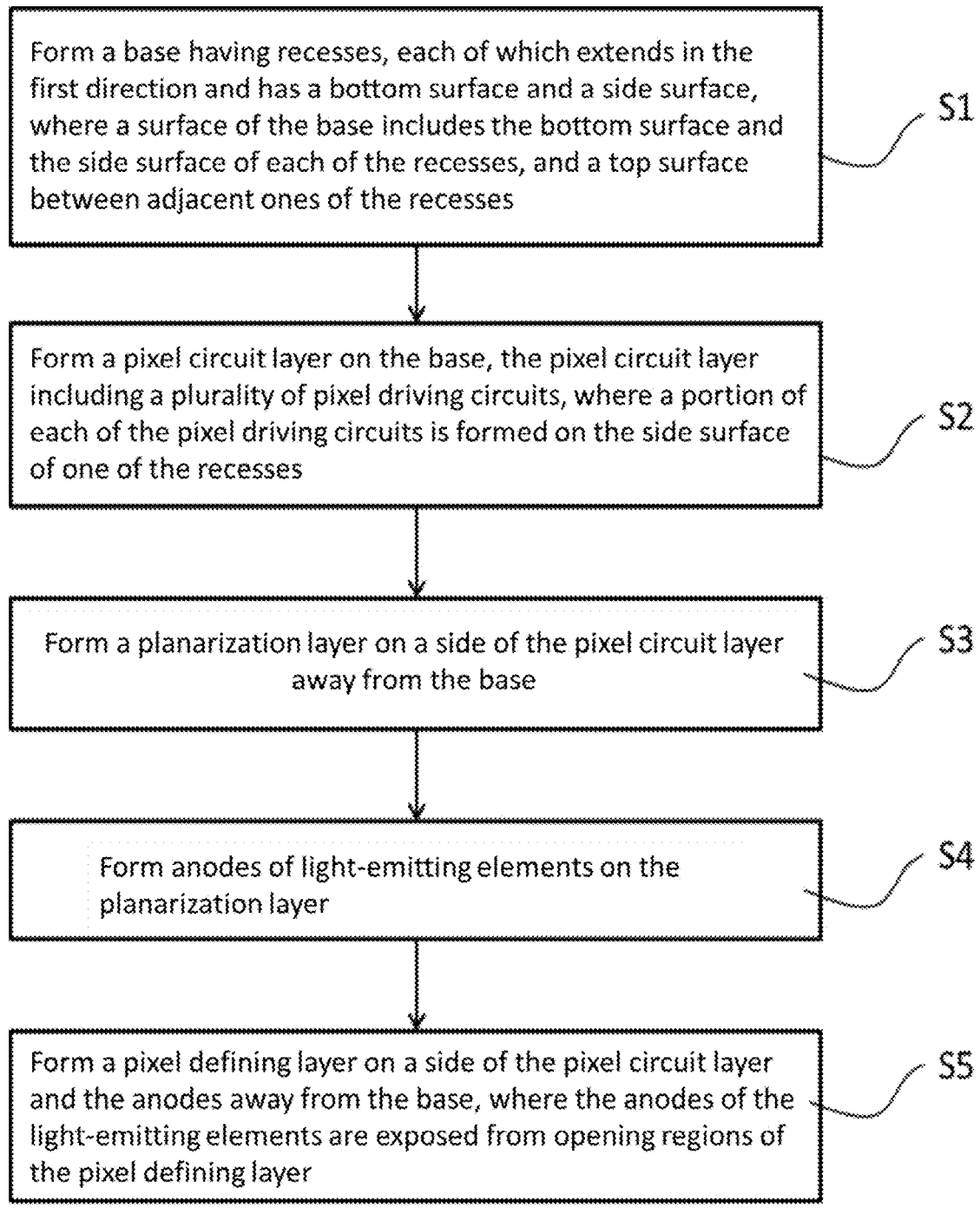
FIG. 12 shows another flowchart of a method for preparing a display substrate according to an embodiment of the present disclosure.

In some implementations, as shown in FIG. 12, the method further includes: S3, forming a planarization layer 5 on a side of the pixel circuit layer 2 away from the base 1; S4, forming anodes 7 of light-emitting elements on the planarization layer 5; and S5, forming a pixel defining layer 6 on a side of the pixel circuit layer 2 and the anodes 7 away from the base 1. The anodes 7 of the light-emitting elements are exposed from opening regions of the pixel defining layer 6.

It will be appreciated that the anodes 7 of the light-emitting elements may be connected to the pixel driving circuits in the pixel circuit layer 2 through vias in the planarization layer 5, and the planarization layer 5 may be formed by spin coating, inkjet printing, 3D printing, or the like. The vias in the planarization layer 5 may be formed by photolithography, etching using a mask or the like after the planarization layer 5 is formed, or the planarization layer 5 with vias may be directly formed by printing.

Figure 13:
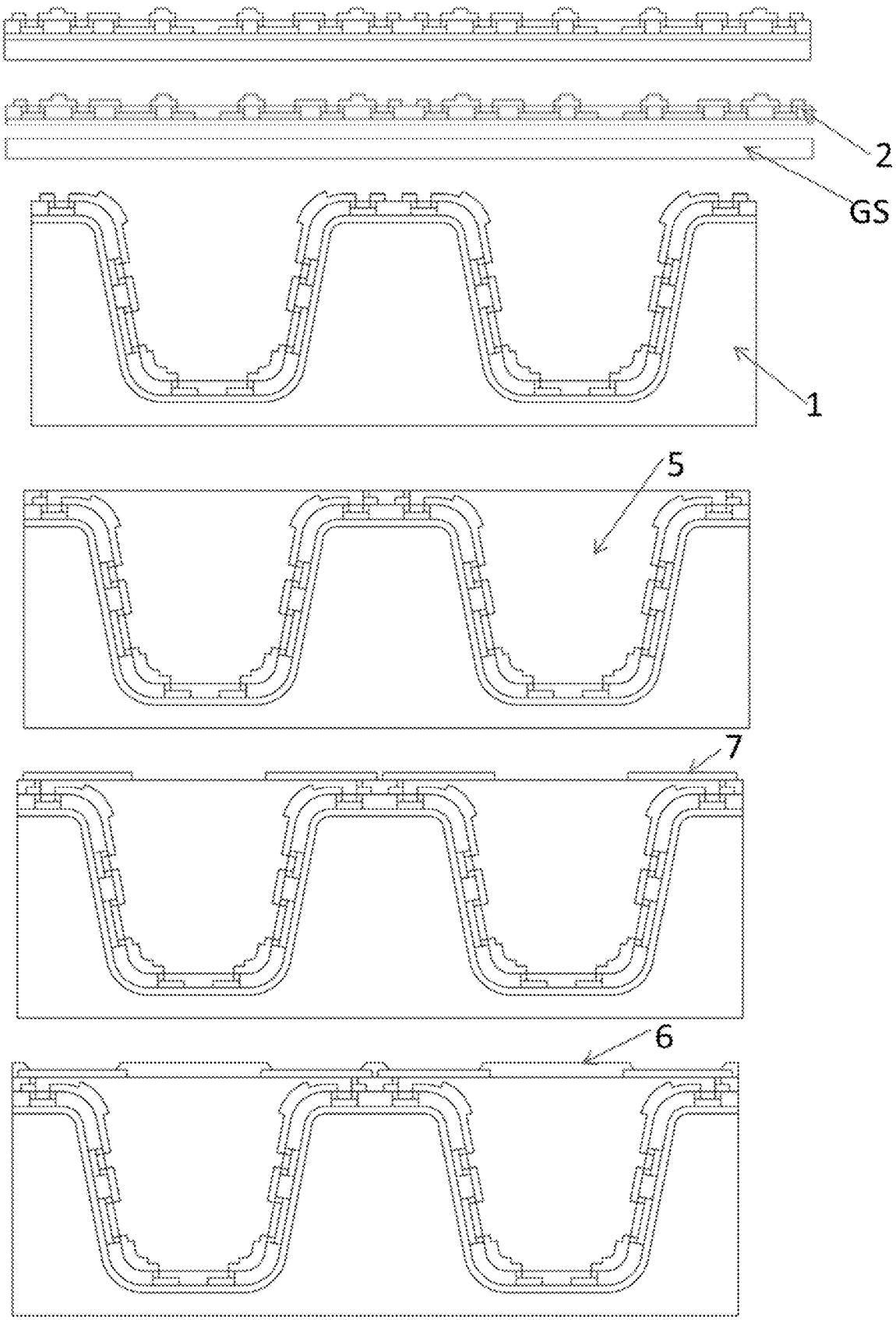
FIG. 13 shows a schematic diagram of a procedure for preparing a display substrate according to an embodiment of the present disclosure.

FIG. 13 shows a schematic diagram of a procedure for preparing a display substrate according to an embodiment of the present disclosure.

As shown in FIG. 13, the pixel circuit layer 2 is firstly formed on a glass sheet GS, and then peeled off from the glass sheet GS; then the pixel circuit layer 2 is attached to a base 1, and a planarization layer 5 is formed on the pixel circuit layer 2; then, anodes 7 of light-emitting elements corresponding to (e.g., in one-to-one correspondence with) the pixel driving circuits in the pixel circuit layer 2 are formed on a side of the planarization layer 5 away from the pixel circuit layer 2, where the anodes 7 of the light-emitting elements may be connected to the pixel driving circuits in the pixel circuit layer 2 through vias in the planarization layer 5; and then a pixel defining layer 6 is formed, where the anodes 7 of the light-emitting elements are exposed from opening regions of the pixel defining layer 6.

It should be noted that, in the present disclosure, relational terms such as first and second, are used merely for distinguishing one entity or operation from another without necessarily requiring or implying that there is any such actual relationship or order between such entities or operations. Moreover, the term "comprise," "include" or any variant thereof means to be non-exclusive so that an item, method or process including a series of elements includes not only said elements, but also other elements not explicitly listed, or inherent elements of such item, method or process. In the absence of more limitations, an element defined by "comprising a . . . " does not exclude the existence of additional identical elements in the item, method or process including the element.

The embodiments of the present disclosure are not intended to be exhaustive or to limit the present disclosure to the precise embodiments disclosed. Apparently, many modifications and variations are possible in light of the above description. The present disclosure has chosen and described these specific embodiments in detail merely for better illustration of the principles and practical applications of the present disclosure so that those skilled in the art can make good use of the present disclosure as well as modified applications based on the present disclosure. The present disclosure is intended to be limited only by the claims and the full scope and equivalents thereof.

What is claimed is:

1. A display substrate, comprising a base, and a pixel circuit layer formed on the base, the pixel circuit layer comprises a plurality of pixel driving circuits which are arranged in an array along a first direction and a second direction perpendicular to the first direction, wherein the base has recesses, each of which extends in the first direction and has a bottom surface and a side surface, a surface of the base comprises the bottom surface and the side surface of each of the recesses, and a top surface between adjacent ones of the recesses, the bottom surface of each of the recesses is substantially parallel to the top surface between adjacent ones of the recesses, the side surface of each of the recesses is at a first angle to the bottom surface of the recess and the top surface between adjacent ones of the recesses, and a portion of each of the pixel driving circuits is formed on the side surface of one of the recesses, wherein each of the pixel driving circuits comprises a driving sub-circuit, a data write sub-circuit, a light emission control sub-circuit, a reset sub-circuit and a storage sub-circuit, the driving sub-circuit, the data write sub-circuit and the storage sub-circuit are formed on the side surface of the recess, the light emission control sub-circuit is formed on the top surface between adjacent ones of the recesses, and the reset sub-circuit are formed on the bottom surface of the recess, the driving sub-circuit comprises a first transistor, the data write sub-circuit comprises a second transistor and a third transistor, the storage sub-circuit comprises a storage capacitor, the light emission control sub-circuit comprises a fourth transistor and a fifth transistor, and the reset sub-circuit comprises a sixth transistor, a gate of the first transistor is connected to a first electrode of the second transistor, a first electrode of the storage capacitor, and a first electrode of the sixth transistor, a first electrode of the first transistor is connected to a first electrode of the fourth transistor and a first electrode of the third transistor, and a second electrode of the first transistor is connected to a second electrode of the second transistor and a second electrode of the fifth transistor, gates of the second transistor and the third transistor each are connected to a scan signal line, a second electrode of the third transistor is connected to a data signal line, and a second electrode of the storage capacitor is connected to a first power supply line, a second electrode of the fourth transistor is connected to the first power supply line, and gates of the fourth transistor and the fifth transistor each are connected to a light emission control line, a first electrode of the fifth transistor is connected to an anode of a light-emitting element, and a gate of the sixth transistor is connected to a reset control line, and a second electrode of the sixth transistor is connected to a reset signal line.

2. The display substrate according to claim 1, wherein each of the pixel driving circuits comprises a driving sub-circuit on the side surface of the recess.

3. The display substrate according to claim 1, wherein each of the pixel driving circuits comprises a storage sub-circuit on the side surface of the recess.

4. The display substrate according to claim 1, wherein each of the pixel driving circuits comprises a data write sub-circuit on the side surface of the recess.

5. The display substrate according to claim 1, wherein each of the pixel driving circuits comprises a light emission control sub-circuit on the top surface between adjacent ones of the recesses.

6. The display substrate according to claim 1, wherein each of the pixel driving circuits comprises a reset sub-circuit on the bottom surface of the recess.

7. The display substrate according to claim 1, wherein each of the pixel driving circuits comprises a signal line extending in the first direction.

8. The display substrate according to claim 1, wherein each of the pixel driving circuits comprises a signal line extending in the second direction, the signal line comprises a first portion, a second portion and a third portion, a distance from the first portion to a first bending line where the bottom surface and the side surface of the recess intersect is less than or equal to a first distance, a distance from the second portion to a second bending line where the side surface of the recess and the top surface between adjacent ones of the recesses intersect is less than or equal to a second distance, a distance from the third portion to the first bending line is greater than the first distance, and a distance from the third portion to the second bending line is greater than the second distance, wherein in a direction parallel to the first bending line, the first portion has a width greater than that of the third portion, and in a direction parallel to the second bending line, the second portion has a width greater than that of the third portion.

9. The display substrate according to claim 1, wherein each of the pixel driving circuits comprises a signal line extending in the second direction, the signal line comprises a first portion, a second portion and a third portion, a distance from the first portion to a first bending line where the bottom surface and the side surface of the recess intersect is less than or equal to a first distance, a distance from the second portion to a second bending line where the side surface of the recess and the top surface between adjacent ones of the recesses intersect is less than or equal to a second distance, a distance from the third portion to the first bending line is greater than the first distance, and a distance from the third portion to the second bending line is greater than the second distance, wherein in a direction away from the bottom surface and the side surface of the recess, the first portion has a thickness greater than that of the third portion, and in a direction away from the side surface of the recess and the top surface between adjacent ones of the recesses, the second portion has a thickness greater than that of the third portion.

10. The display substrate according to claim 1, further comprising: a flexible material layer between the base and the pixel circuit layer, a first stress relief structure is formed in a first portion of the flexible material layer, a distance from the first portion of the flexible material layer to a first bending line where the bottom surface and the side surface of the recess intersect is less than or equal to a first preset distance, and a second stress relief structure is formed in a second portion of the flexible material layer, a distance from the second portion of the flexible material layer to a second bending line where the side surface of the recess and the top surface between adjacent ones of the recesses intersect is less than or equal to a second preset distance, wherein each of the first stress relief structure and the second stress relief structure comprises a plurality of trapezoidal blocks which are disposed at intervals, in the first stress relief structure, an end of each of the trapezoidal blocks away from the base has a size smaller than that of an end of the trapezoidal block closer to the base, and in the second stress relief structure, an end of each of the trapezoidal blocks closer to the base has a size smaller than that of an end of the trapezoidal block away from the base.

11. The display substrate according to claim 1, wherein the side surface and the bottom surface of each of the recesses are connected through a first arc surface, and the side surface of each of the recesses and the top surface between adjacent ones of the recesses are connected through a second arc surface.

12. The display substrate according to claim 1, wherein in the second direction, adjacent ones of the pixel driving circuits are mirrored.

13. The display substrate according to claim 1, wherein in the second direction, adjacent ones of the pixel driving circuits share the reset signal line.

14. The display substrate according to claim 1, wherein the reset control line, the reset signal line, the scan signal line, and the light emission control line each extend in the first direction, and the data signal line and the first power supply line each comprise a portion extending in the second direction.

15. The display substrate according to claim 1, wherein the scan signal line, the reset control line, the light emission control line, the first electrode of the storage capacitor, and the gates of the transistors are formed in a same layer and in a first sub-layer of the pixel circuit layer, the reset signal line and the second electrode of the storage capacitor are formed in a same layer and in a second sub-layer of the pixel circuit layer, and the data signal line, the first power supply line, and the first and second electrodes of the transistors are formed in a same layer and in a third sub-layer of the pixel circuit layer.

16. A method for preparing a display substrate, comprising:
forming a base having recesses, each of which extends in the first direction and has a bottom surface and a side surface, a surface of the base comprises the bottom surface and the side surface of each of the recesses, and a top surface between adjacent ones of the recesses, the bottom surface of each of the recesses is substantially parallel to the top surface between adjacent ones of the recesses, and the side surface of each of the recesses is at a first angle to the bottom surface of the recess and the top surface between adjacent ones of the recesses; and
forming a pixel circuit layer on the base, the pixel circuit layer comprising a plurality of pixel driving circuits which are arranged in an array along a first direction and a second direction perpendicular to the first direction, wherein
a portion of each of the pixel driving circuits is formed on the side surface of one of the recesses,
wherein the forming a pixel circuit layer on the base comprises:
forming a flexible material layer on a glass sheet;
forming the pixel driving circuits on the flexible material layer;
peeling off the flexible material layer and the pixel driving circuits formed on the flexible material layer from the glass sheet; and
attaching the flexible material layer and the pixel driving circuits formed on the flexible material layer to the base,
wherein the forming the pixel driving circuits on the flexible material layer comprises:
forming a signal line extending in the first direction and a signal line extending in the second direction, and widening and thickening a first portion and a second portion of the signal line extending in the second direction, wherein
after attaching the flexible material layer and the pixel driving circuits formed on the flexible material layer to the base, a distance from the first portion to a first bending line where the bottom surface and the side surface of the recess intersect is less than or equal to a first distance, and a distance from the second portion to a second bending line where the side surface of the recess and the top surface between adjacent ones of the recesses intersect is less than or equal to a second distance.

17. The method according to claim 16, wherein the forming a base comprises:
forming the base in a preformed mold by using a flexible material.

18. The method according to claim 16, further comprising:
forming a sacrificial material layer on the glass sheet prior to forming the flexible material layer on the glass sheet;
patterning the sacrificial material layer to form a first stress relief structure and a second stress relief structure, wherein each of the first stress relief structure and the second stress relief structure comprises a plurality of trapezoidal blocks which are disposed at intervals, in the first stress relief structure, an end of each of the trapezoidal blocks away from the glass sheet has a size smaller than that of an end of the trapezoidal block closer to the glass sheet, and in the second stress relief structure, an end of each of the trapezoidal blocks closer to the glass sheet has a size smaller than that of an end of the trapezoidal block away from the glass sheet, wherein
the first stress relief structure and the second stress relief structure are embedded in the flexible material layer after the flexible material layer is formed on the glass sheet,
when the flexible material layer and the pixel driving circuits formed on the flexible material layer are peeled off from the glass sheet, the first stress relief structure and the second stress relief structure are peeled off from the glass sheet along with the flexible material layer, and
after attaching the flexible material layer and the pixel driving circuits formed on the flexible material layer to the base, a distance from the first stress relief structure to a first bending line where the bottom surface and the side surface of the recess intersect is less than or equal to a first preset distance, and a distance from the second stress relief structure to a second bending line where the side surface of the recess and the top surface between adjacent ones of the recesses intersect is less than or equal to a second preset distance.

19. A display substrate, comprising a base, and a pixel circuit layer formed on the base, the pixel circuit layer comprises a plurality of pixel driving circuits which are arranged in an array along a first direction and a second direction perpendicular to the first direction, wherein the base has recesses, each of which extends in the first direction and has a bottom surface and a side surface, a surface of the base comprises the bottom surface and the side surface of each of the recesses, and a top surface between adjacent ones of the recesses, the bottom surface of each of the recesses is substantially parallel to the top surface between adjacent ones of the recesses, the side surface of each of the recesses is at a first angle to the bottom surface of the recess and the top surface between adjacent ones of the recesses, and a portion of each of the pixel driving circuits is formed on the side surface of one of the recesses,
the display substrate further comprises: a flexible material layer between the base and the pixel circuit layer, a first stress relief structure is formed in a first portion of the flexible material layer, a distance from the first portion of the flexible material layer to a first bending line where the bottom surface and the side surface of the recess intersect is less than or equal to a first preset distance, and a second stress relief structure is formed in a second portion of the flexible material layer, a distance from the second portion of the flexible material layer to a second bending line where the side surface of the recess and the top surface between adjacent ones of the recesses intersect is less than or equal to a second preset distance, wherein each of the first stress relief structure and the second stress relief structure comprises a plurality of trapezoidal blocks which are disposed at intervals, in the first stress relief structure, an end of each of the trapezoidal blocks away from the base has a size smaller than that of an end of the trapezoidal block closer to the base, and in the second stress relief structure, an end of each of the trapezoidal blocks closer to the base has a size smaller than that of an end of the trapezoidal block away from the base.

* * * * *